United States Patent
Nam

(10) Patent No.: US 7,220,467 B2
(45) Date of Patent: May 22, 2007

(54) PHOTO-ALIGNMENT MATERIAL AND LIQUID CRYSTAL DISPLAY DEVICE AND ITS MANUFACTURING METHOD USING THE SAME

(75) Inventor: Mi Sook Nam, Kunpo-shi (KR)

(73) Assignee: LG.Phillips LCD Co., Ltd., Seoul (KR)

( * ) Notice: Subject to any disclaimer, the term of this patent is extended or adjusted under 35 U.S.C. 154(b) by 262 days.

(21) Appl. No.: 10/630,738

(22) Filed: Jul. 31, 2003

(65) Prior Publication Data

US 2004/0022963 A1 Feb. 5, 2004

Related U.S. Application Data

(62) Division of application No. 09/893,977, filed on Jun. 29, 2001, now Pat. No. 6,627,269.

(30) Foreign Application Priority Data

Dec. 5, 2000 (KR) ............................... 2000-73270

(51) Int. Cl.
*G02F 1/1337* (2006.01)
(52) U.S. Cl. ..................... 428/1.2; 428/1.25; 428/1.26; 349/135
(58) Field of Classification Search ...... 428/1.23–1.28; 349/123–136
See application file for complete search history.

(56) References Cited

U.S. PATENT DOCUMENTS

| | | | |
|---|---|---|---|
| 4,416,973 A * | 11/1983 | Goff | 430/281.1 |
| 4,974,941 A | 12/1990 | Gibbons et al. | 350/349 |
| 4,974,991 A | 12/1990 | Mandavi | 404/6 |
| 5,032,009 A | 7/1991 | Gibbons et al. | 350/341 |
| 5,118,538 A * | 6/1992 | Escher et al. | 428/1.2 |
| 5,239,398 A * | 8/1993 | Yanagisawa et al. | 349/135 |
| 5,389,698 A | 2/1995 | Chigrinov et al. | 522/2 |

(Continued)

FOREIGN PATENT DOCUMENTS

EP 0525473 A2 2/1993

(Continued)

OTHER PUBLICATIONS

Yamamoto, Derwent Abstract of JP 11-140168, May 1999.*

(Continued)

*Primary Examiner*—Rena Dye
*Assistant Examiner*—Sow-Fun Hon
(74) *Attorney, Agent, or Firm*—McKenna Long & Aldridge LLP

(57) ABSTRACT

A photo-alignment material, a liquid crystal display device using the photo-alignment material, and a manufacturing method. The photo-alignment material is a polymer having a photo-reactive ethenyl group on a main chain. When used as a photo-alignment layer, the photo-alignment material enables improved alignment stability against external shocks, light, and heat. The liquid crystal display device includes a first substrate, a second substrate, a liquid crystal layer formed between the first and second substrates, and a photo-alignment layer formed at least on the first substrate, with the photo-alignment layer formed from a photo-alignment material having an ethenyl group at a main chain.

3 Claims, 1 Drawing Sheet

U.S. PATENT DOCUMENTS

| | | | |
|---|---|---|---|
| 5,389,998 A | 2/1995 | Dunsmore et al. | 354/484 |
| 5,464,669 A | 11/1995 | Kang et al. | 428/1 |
| 5,486,560 A * | 1/1996 | Shiga et al. | 524/401 |
| 5,538,823 A | 7/1996 | Park et al. | 430/20 |
| 5,656,340 A | 8/1997 | Ubukata et al. | 428/1 |
| 5,705,096 A | 1/1998 | Kano et al. | 252/299.4 |
| 5,767,994 A | 6/1998 | Kang et al. | 359/72 |
| 5,824,377 A | 10/1998 | Pirwitz et al. | 428/1 |
| 5,928,561 A | 7/1999 | Bryan-Brown et al. | 252/299.4 |
| 5,998,563 A | 12/1999 | Pirwitz et al. | 528/26 |
| 6,184,959 B1 * | 2/2001 | Izumi | 349/124 |
| 6,270,938 B1 * | 8/2001 | Gandini et al. | 430/157 |
| 6,274,695 B1 * | 8/2001 | Endou et al. | 528/170 |
| 6,627,269 B2 * | 9/2003 | Nam | 428/1.2 |
| 6,682,783 B1 * | 1/2004 | Tomioka et al. | 428/1.1 |
| 6,770,335 B2 * | 8/2004 | Shin et al. | 428/1.25 |
| 6,797,096 B2 * | 9/2004 | Nam | 156/145 |

FOREIGN PATENT DOCUMENTS

| | | |
|---|---|---|
| EP | 0525473 A3 | 2/1993 |
| EP | 0525478 A2 | 2/1993 |
| EP | 0611786 A1 | 8/1994 |
| EP | 0742471 A2 | 11/1996 |
| EP | 0742471 A3 | 11/1996 |
| EP | 0750212 A2 | 12/1996 |
| JP | 11-140168 * | 5/1999 |

OTHER PUBLICATIONS

Martin Schadt et al., "Surface-Induced Parallel Alignment of Liquid Crystals by Linearly Polymerized Photopolymers." *Jpn. J. Appl. Phys.* vol. 31, 1992, pp. 2155-2164.

Iimura et al. "Invited Address: Electro-Optic Characteristics of Amorphous and Super-Multidomain TN-LCDs Prepared by a Non-Rubbing Method." *SID 94 DIGEST*. pp. 915-918.

Hashimoto et al. "TN-LCD with Quartered Subpixels Using Polarized UV-Light-Irradiated Polymer Orientation Films." *SID 95 DIGEST*. pp. 877-880.

Lim et al. "Tilting of Liquid Crystal Light Through Interaction with Methyl Orange Molecules Oriented by Circularly Polarized Light." *Jpn. J. Appl. Phys.* vol. 35 (1996) pp. 1281-1283.

* cited by examiner

PHOTO-ALIGNMENT MATERIAL AND LIQUID CRYSTAL DISPLAY DEVICE AND ITS MANUFACTURING METHOD USING THE SAME

This application is a divisional of U.S. patent application Ser. No. 09/893,977 filed Jun. 29, 2001 now U.S. Pat. No. 6,627,269.

BACKGROUND OF THE INVENTION

1. Field of the Invention

The present invention relates to alignment layers for liquid crystal display devices (hereinafter abbreviated LCD). More particularly, it relates to a photo-alignment material having a photo-reactive functional group of ethenyl at a main-chain, and to the use of that material in liquid crystal displays.

2. Background of the Related Art

Flat panel LCD devices have become widely used as displays for mobile terminals, notebook computers, office equipment, video equipment, and the like. This is because flat panel LCD devices have advantages of small-size, lightweight, and low power consumption.

In general, an LCD includes a pair of substrates that are separated by a predetermined interval, and an interposed liquid crystal.

An LCD has numerous functional requirements, including light transmission characteristics, operational response time, viewing angle, and contrast. Many of those requirements are impacted by the alignment characteristics of the liquid crystal molecules in the LCD. Indeed, uniformly aligned liquid crystal molecules are important to the electro-optical characteristics of LCDs.

The alignment characteristics of LCDs are results of an alignment layer. Generally, a rubbing technique has been used to form that layer. In that technique, a special cloth is rubbed over a substrate to form the alignment layer. While the rubbing technique is a simple process, it has problems. For example, various process variables related to rubbing are difficult to accurately control. Furthermore, dust adsorption, unwanted scratches generated by the rubbing, and damage to thin film transistors caused by static electricity can also result from the rubbing. Such problems reduce the manufacturing yield and the performance of LCDs.

Because of the forgoing problems, significant effort has been expended in developing alignment techniques that do not use mechanical rubbing. In particular, photo-alignment methods could solve the static electricity and dust problems, as well as improve the viewing angle.

Photo-alignment methods include photo-decomposition, photo-polymerization, and photo-isomerization. In these methods, optical anisotropy is brought about in a polymer layer by inducing a photo-reaction after most of the molecules facing a polarizing direction in the disorderly-aligned polymer molecules have absorbed light.

In the photo-decomposition method, liquid crystals are arranged by inducing optical anisotropy using a photo-decomposition reaction that selectively breaks partial bonds of the molecules in a specific direction by the application of linearly-polarized ultraviolet rays to a polymer layer consisting of a photo-alignment material. The material typically used for this method is polyimide. Although polyimide requires the application of ultraviolet rays for a relatively long time to induce liquid crystal alignment, a polyimide alignment layer formed by photo-decomposition has a relatively-high thermal stability as compared to other photo-alignment layers fabricated by other methods.

In the photo-polymerization method, liquid crystals are arranged by polymerizing the molecules in a specific direction by applying linearly-polarized rays to a polymer layer where polymerization is to occur.

In the photo-isomerization method, cis/trans isomers are formed by a polarized light. Thus, liquid crystals are aligned by the direction generated from the transformation of the produced isomers. Although the alignment direction is reversibly controlled by applying light of a specific wave length, it is difficult to give a pre-tilt angle to a liquid crystal as well as to maintain the stability of the liquid crystal.

The chemical structure of photo-alignment materials is mainly divided into two categories: a main chain, and side chains including photo-sensitive groups such as an alkyl group, an ethenyl group and the like. The main chain makes liquid crystal molecules arrange to face a predetermined direction, while the side chains form a pre-tilt angle.

Photo-reactions take place at side chains having photo-sensitive groups when light is irradiated onto them. Thus, liquid crystal alignment depends on the side chains. Therefore, liquid crystal alignment of the photo-alignment material is controlled by the side chains, which include hydrocarbon branches such as alkyl, ethenyl and the like.

Unfortunately, related art photo-alignment materials, and LCDs using the same, have problems. As noted, the photo-alignment of a photo-alignment layer according to the related art is controlled by the side chains. As the side chains are flexible and fragile, that alignment tends to be easily broken by thermal, physical, electrical, and photo shocks. Furthermore, the alignment tends to be hard to restore. Additionally, the photo-alignment layer used in the photo-decomposition method has such poor photo-sensitivity that relatively high light intensity is required to break the predetermined bonds of the side chain or main chain. Finally, in general, with related art photo-alignment layers the actual liquid crystal alignment is relatively poor.

SUMMARY OF THE INVENTION

Accordingly, the present invention is directed to a photo-alignment material, to a liquid crystal display device that incorporates that photo-alignment material, and to a method of manufacturing a liquid crystal display device that incorporates that photo-alignment material, wherein that photo-alignment material substantially obviates one or more of the problems due to limitations and disadvantages of the related art.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages, and in accord with the principles of the present invention as embodied and broadly described, a photo-alignment material according to the present invention includes at least a photo-reactive ethenyl functional group at a polymer main chain.

In another aspect, a liquid crystal display device in accord with the principles of the present invention includes a first substrate, a second substrate, a liquid crystal layer between the first and second substrates, and a photo-alignment layer on the first and/or the second substrate. That photo-alignment layer includes an ethenyl group on a main chain of the photo-alignment material.

In another aspect, a method of fabricating a liquid crystal display device according to the principles of the present invention includes preparing a first substrate and a second substrate, forming a photo-alignment layer having an ethenyl group at a main chain on at least the first substrate; and forming a liquid crystal layer between the first and second substrates.

It is to be understood that both the foregoing general description and the following detailed description are exemplary and explanatory and are intended to provide further explanation of the invention as claimed.

BRIEF DESCRIPTION OF THE DRAWINGS

The accompanying FIG. 1, which is included to provide a further understanding of the invention and which is incorporated in and constitutes a part of this specification, illustrates an embodiment of the invention and together with the description serves to explain the principles of the invention. Specifically.

DETAILED DESCRIPTION OF AN ILLUSTRATED EMBODIMENTS

Figure 1:
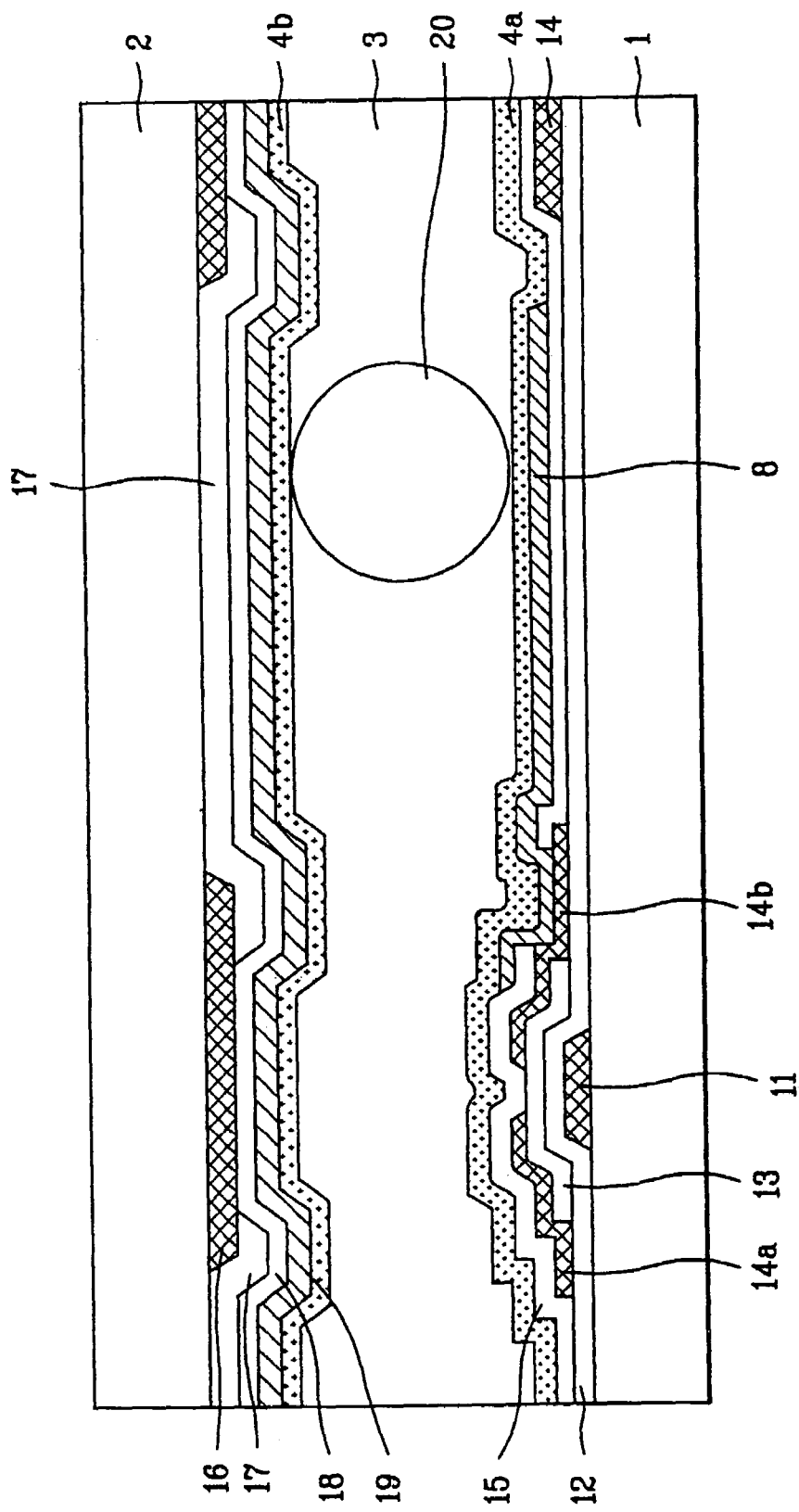
FIG. 1 shows a cross-sectional view of a general liquid crystal display device.

Reference will be made in detail to an illustrated preferred embodiment of the present invention, the example of which is illustrated in the accompanying drawing. In the illustrated embodiment a liquid crystal display device includes a first substrate, a second substrate, a liquid crystal layer formed between the first and second substrates, and a photo-alignment layer formed at least on the first substrate, wherein the photo-alignment layer is formed from a photo-alignment material having an ethenyl group in a main chain. The alignment stability with respect to thermal, physical, electrical, and photo shocks is increased by that photo-alignment layer. More specifically, a photo-alignment material according to the present invention consists of polymers denoted by the following Chemical Formula 1.

{Chemical Formula 1}

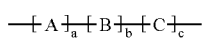

Components 'A', 'B', and 'C' are monomers constituting the polymer and are selectively coupled to produce a homopolymer, a copolymer, or a block-copolymer. The arrangement order of components 'A', 'B', and 'C' is not limited by the above Chemical Formula 1. Furthermore, subscripts 'a', 'b', and 'c' denote component ratios between the respective monomers, where $0<a\leq1$, $0\leq b<1$, and $0\leq c<1$.

Component 'A' is a monomer including a photo-reactive ethenyl group. That component is selected from groups designated in the following Chemical Formula 2, substituted-structure groups of Chemical Formula 2 with a halogen, a cyano, a nitro, an amino group and the like, and other substituted-structure groups with an alkyl, a haloalkyl, or a cyanoalkyl group having 1 to 10 carbons, or an aryl, an alkylaryl, a haloaryl, a haloalkyl aryl, a nitroaryl, or a cyanoaryl group having 3 to 8 carbons.

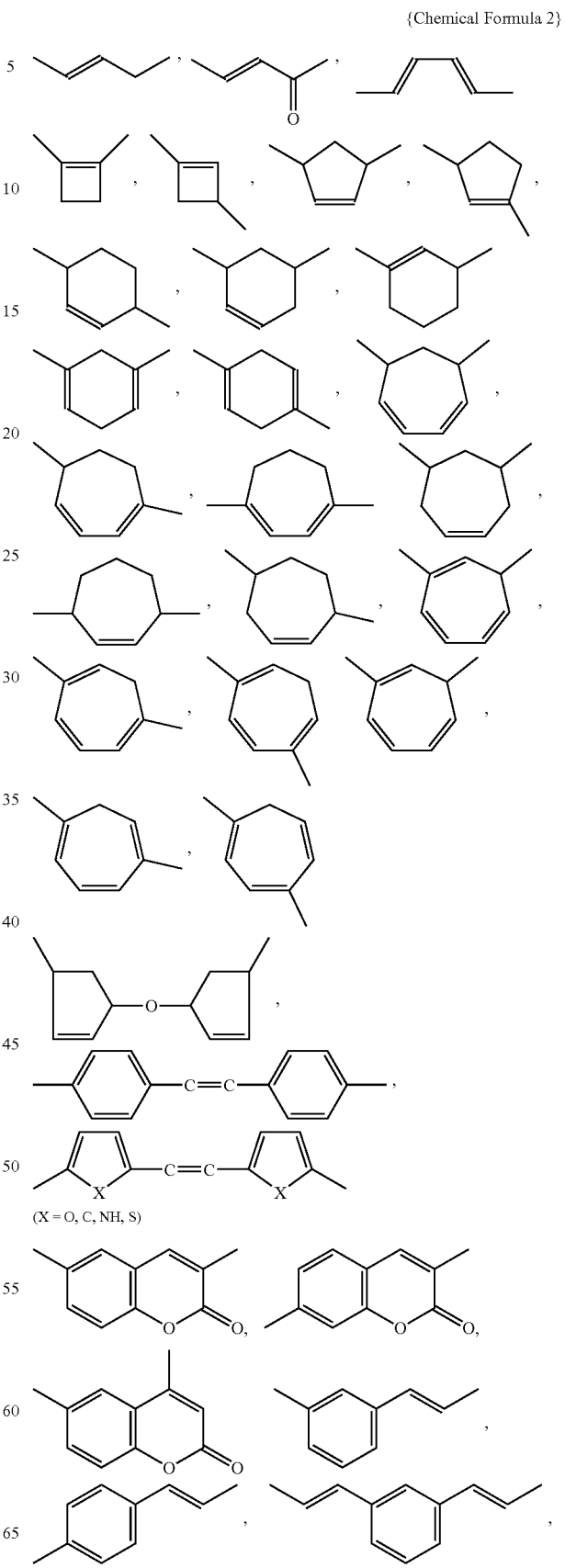

{Chemical Formula 2}

(X = O, C, NH, S)

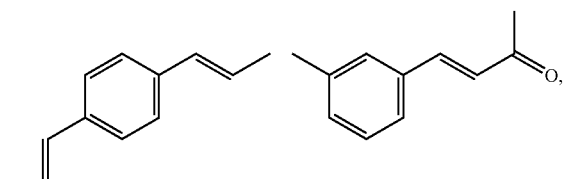
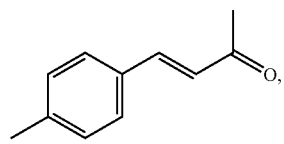
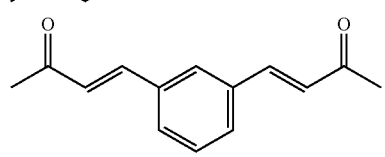
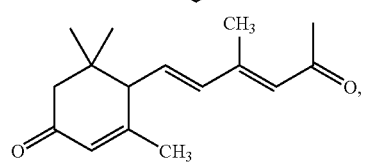
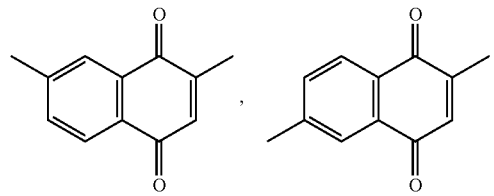
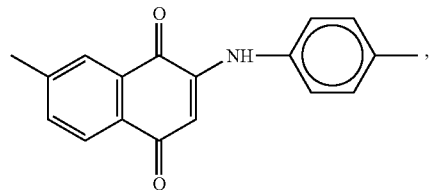
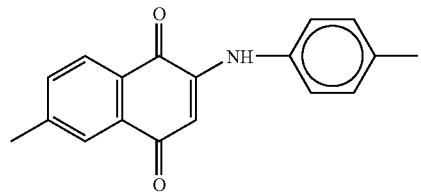
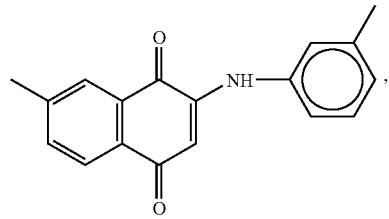
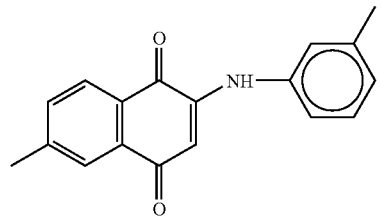

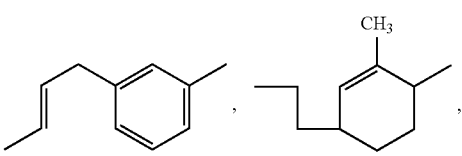
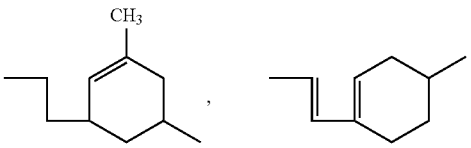

Components 'B' and 'C' are selected independently from the following groups shown in Chemical Formula 3, substituted-structure groups of Chemical Formula 3 with a halogen, a cyano, a nitro, an amino group and the like, and other substituted-structure groups with carbonated groups of which carbon number n lies between 1 and 10 such as an alkyl, a haloalkyl, and a cyanoalkyl or other carbonated groups of which carbon number lies between 3 and 8 such as an alkylaryl, a haloaryl, a nitroaryl, a cyanoaryl and the like.

{Chemical Formula 3}

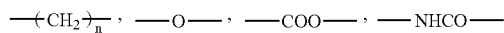
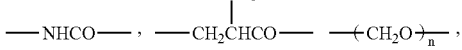
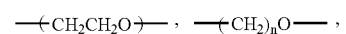
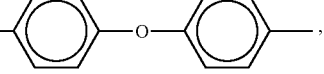
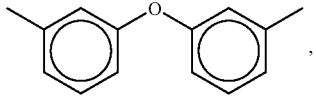
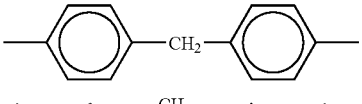
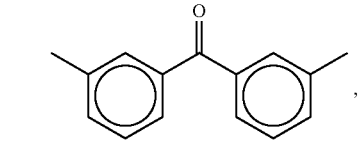
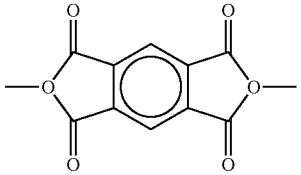

-continued

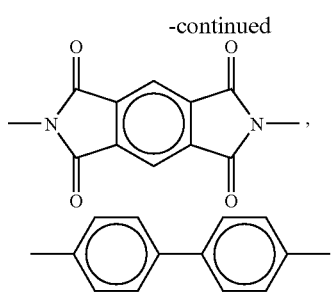

Components 'B' and 'C', which are non-photosensitive components connected to component 'A' regardless of a photo-reactive ethenyl group of the present invention, increase the reaction of the photo-sensitive ethenyl groups, secures a marginal space for the reaction, or increases the reciprocal reaction with liquid crystals.

Therefore, a photo-alignment material according to the principles of the present invention is formed by connecting other main chains to a main chain including a photo-reactive ethenyl group.

The photo-alignment material described above provides a photo-alignment layer in which photo-reactivity and alignment stability are improved.

A liquid crystal display device using the photo-alignment material according to the present invention is explained with reference to FIG. 1, which shows a cross-sectional view of a liquid crystal display device. Referring to FIG. 1, a liquid crystal display device according to the principles of the present invention includes a first substrate 1, a second substrate 2, a liquid crystal layer 3 formed between the first and second substrates, and a spacer 20 that maintains a uniform interval between the substrates 1 and 2.

The first substrate 1 is a substrate for thin film transistor (hereinafter abbreviated TFT) switching devices that selectively turn data signals on/off in accordance with gate voltages. To that end, on the first substrate 1 are a gate line having a gate electrode 11 for a thin film transistor and a gate insulating layer 12 over the substrate and the gate electrode 11. The gate insulating layer is beneficially a silicon nitride layer (SiNx). A semiconductor layer 13 is on the gate insulating layer 12 and over the gate electrode 11. A data line 14 crosses the gate line. A source electrode 14a and a drain electrode 14b are on the semiconductor layer 13. A first passivation layer 15 is formed over the substrate as shown in FIG. 1, including over the source electrode 14a and the drain electrode 14b. The first passivation layer 15 is beneficially of silicon nitride (SiNx) or BCB (Benzocyclo Butene). A pixel electrode 8 that connects to the drain electrode 14b is formed on the first passivation layer 15. The pixel electrode 8 is beneficially of ITO (indium tin oxide). Furthermore, a first alignment layer 4a extends over the surface, including the pixel electrode 8, as shown in FIG. 1.

The second substrate 2 supports a color filter layer for expressing colors. On the second substrate 2 are black matrices 16 that prevents light leakage, a color filter layer 17 (RGB) between neighboring black matrices 16, and a second passivation layer 18 over the entire surface as shown in FIG. 1. The second passivation layer 18 protects the color filter layer 17. A common electrode 19 is then formed on the second passivation layer 18. The common electrode 19 is beneficially comprised of ITO (indium-tin-oxide). A second alignment layer 4b is then formed over the entire surface as shown in FIG. 1.

At least one of the first and second alignment layers 4a and 4b is formed from a photo-alignment material that is in accord with the principles of the present invention. If the other alignment layer is not formed from a photo-alignment layer material, it can be formed by rubbing.

To form a photo-alignment layer using a photo-alignment material as described above (having an ethenyl group in the main chain), the photo-alignment material is uniformly coated on a substrate. That photo-alignment layer material is then thermally treated and dried in an oven. Subsequently, a structure that assists anisotropy of the liquid crystals is attained by irradiating polarized UV rays onto the exposed surface of the photo-alignment layer. The UV rays may be irradiated vertically and slantwise using unpolarized light, non-polarized light, linearly polarized light, partially polarized light or the like, depending on the alignment structure to be implemented.

A photo-alignment layer according to the present invention enables improvement of the optical and thermal stability of the liquid crystal alignment, pre-tilt stability against electric stress, and improved shock-resistance. Moreover, the principles of the present invention enable improved display quality and an improved LCD display manufacturing method.

The foregoing embodiments are merely exemplary and are not to be construed as limiting the present invention. The present inventions can be readily applied to other types of apparatuses. The description of the present invention is intended to be illustrative, and not to limit the scope of the claims. Many alternatives, modifications, and variations will be apparent to those skilled in the art.

What is claimed is:

1. A photo-alignment material having a photo-reactive ethenyl group in a polymer main chain, wherein the polymer is according to chemical formula 1:

{chemical formula 1}

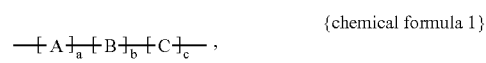

wherein subscripts a, b, and c denote a component ratio of respective monomers, wherein $0<a\leq1$, $0\leq b<1$, and $0\leq c<1$, wherein components B and C are monomeres, and wherein component A is a monomer unit including the photo-reactive ethenyl group selected from structure groups designated in chemical formula 2, substituted-structure groups of chemical formula 2 having a halogen, a cyano, a nitro, an amino group, and other substituted-structure groups with an alkyl, a haloalkyl, and a cyanoalkyl group having 1 to 10 carbons, or an aryl, a haloaryl, a haloalkyl aryl, a nitroaryl, and a cyanoaryl group having 3 to 8 carbons;

{Chemical Formula 2}

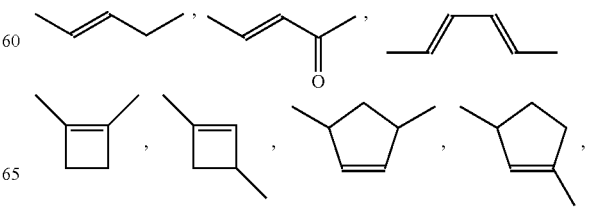

-continued
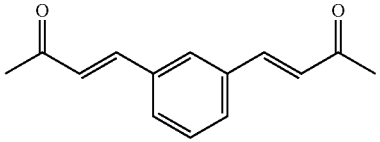

-continued

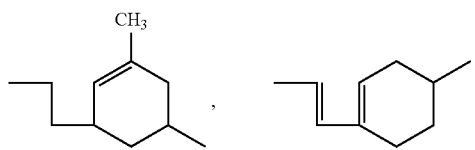

2. The photo-alignment material of claim 1, wherein components B and C are selected independently from groups shown in chemical formula 3, substituted-structure groups of chemical formula 3 with a halogen, a cyano, a nitro, an amino group, other substituted-structure groups with an alkyl, a haloalkyl, and a cyanoalkyl group of which the carbon number lies between 1 and 10 and other substituted-structure groups with an alkylaryl, a haloaryl, a haloalkylaryl, a nitroaryl, and a cyanoaryl group of which the carbon number lies between 3 and 8;

3. A photo-alignment material having a photo-reactive ethenyl group in a polymer main chain, wherein the polymer is according to formula 1:

 {formula 1} wherein subscripts a, b, and c denote a component ratio of respective monomers, wherein $0 < a \leq 1$, $0 \leq b < 1$, and $0 \leq c < 1$, wherein component A is a monomer unit having the photo-reactive ethenyl group of formula 2, and the monomer unit having a photo-reactive ethenyl group of formula 2 can be substituted with at least one selected from the group consisting of a halogen, a cyano, a nitro, an amino group, an alkyl, a haloalkyl, a cyanoalkyl group having 1 to 10 carbons, an aryl, an alkyl, a haloaryl, a haloalkyl aryl, a nitroaryl, and a cyanoaryl group having 3 to 8 carbons;

wherein formula 2 is selected from a group consisting of:

{Chemical Formula 3}

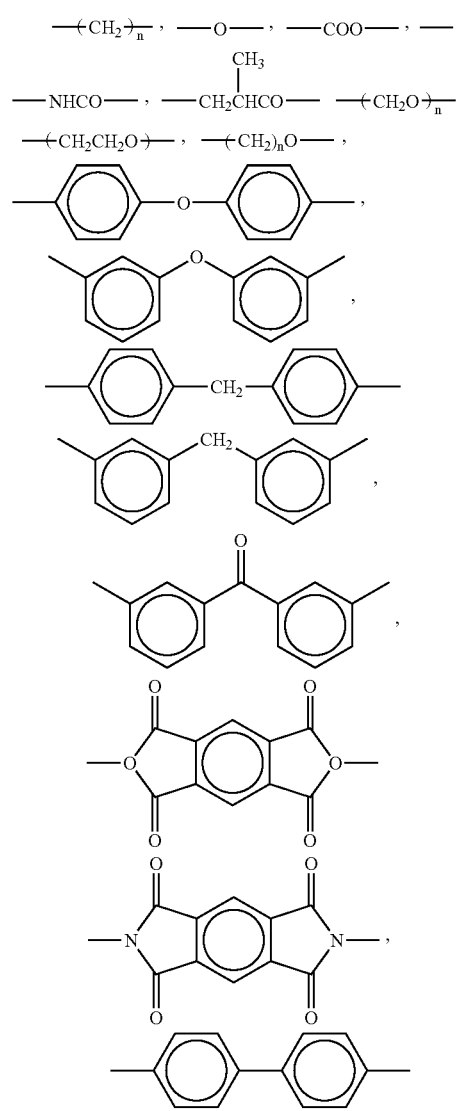

{Chemical Formula 2}

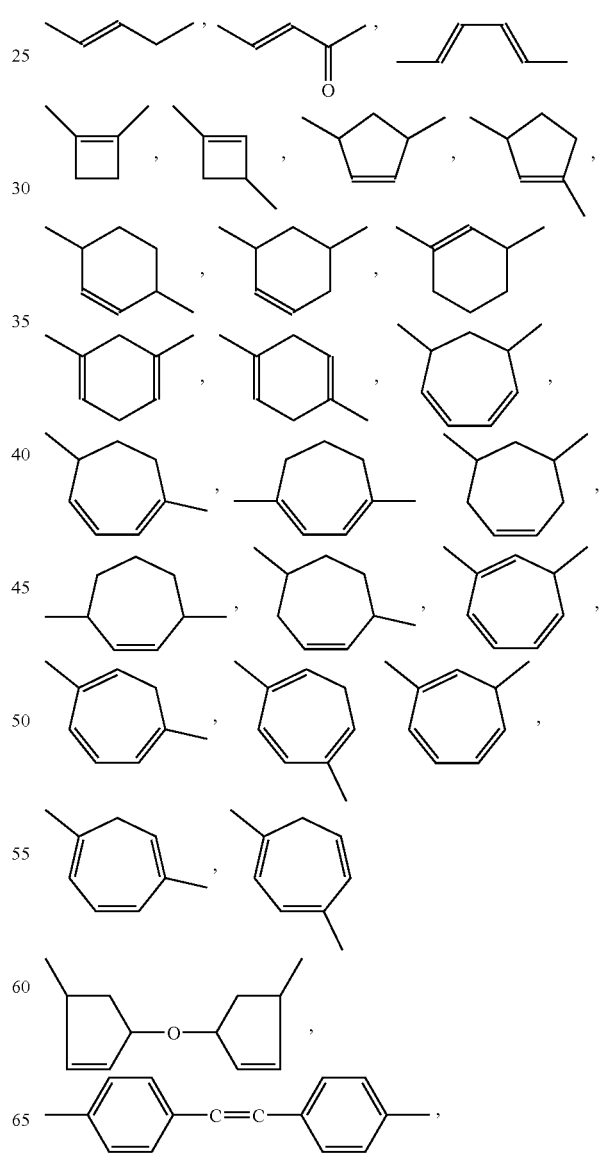

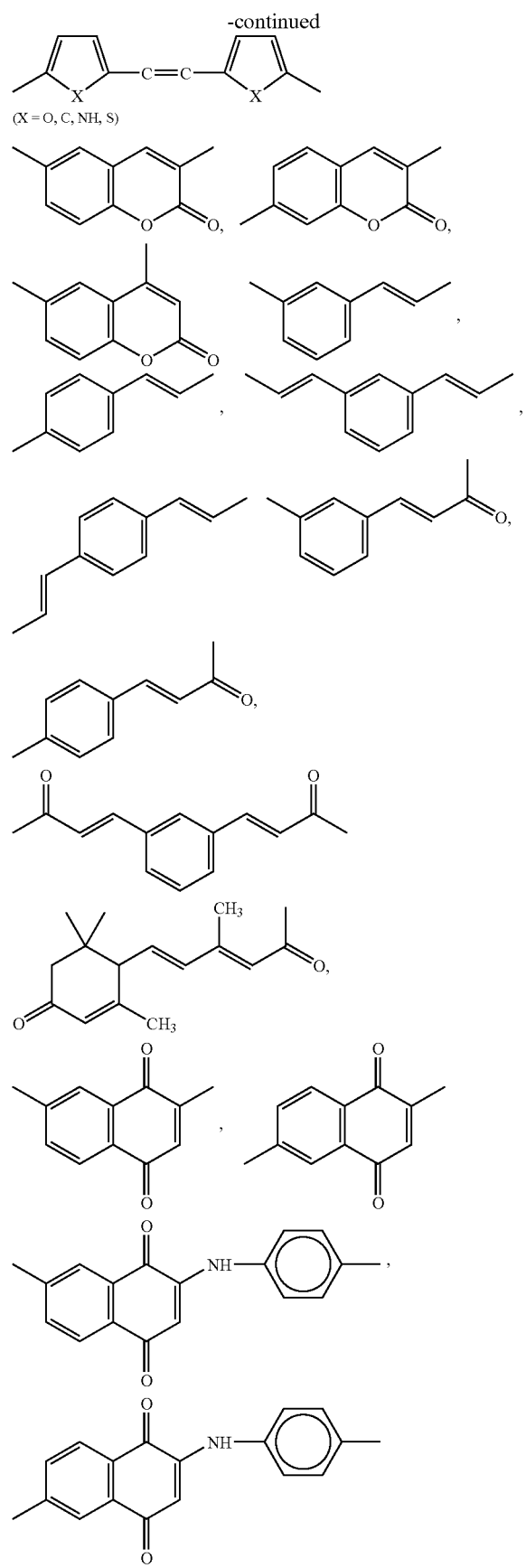

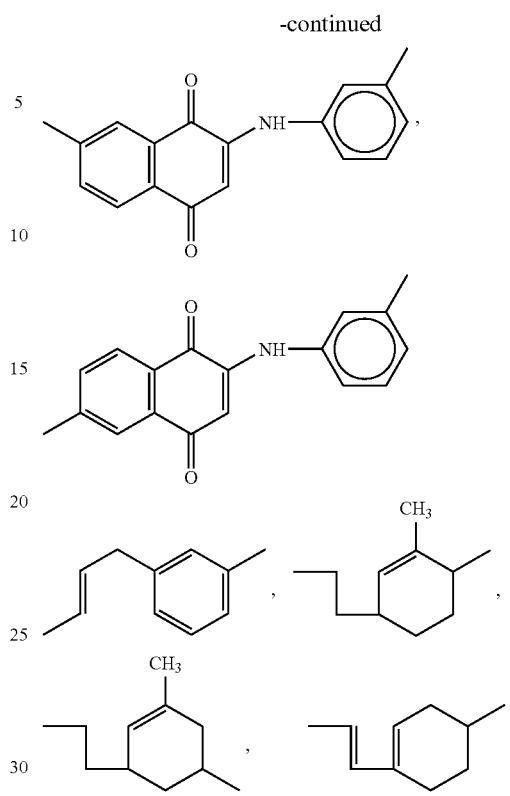

wherein component B and C are monomer units having a non-photosensitive component of formula 3, and the monomer units having a non-photosensitive component of formula 3 can be substituted with at least one selected from the group consisting of a halogen, a cyano, a nitro, an amino, an alkyl, a haloalkyl, a cyanoalkyl, alkylaryl, a haloaryl, a haloalkylaryl a nitroaryl, a cyanoaryl;

wherein formula 3 is selected from a group consisting of:

{Formula 3}

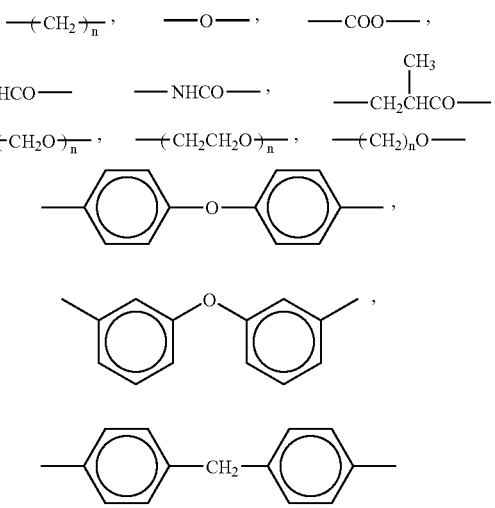

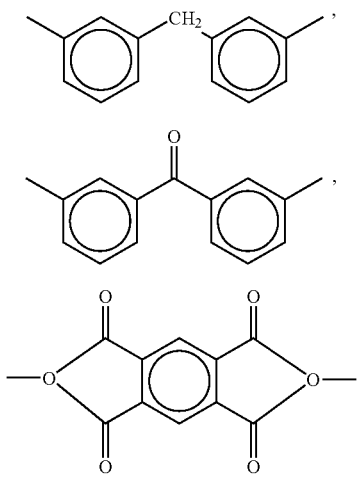
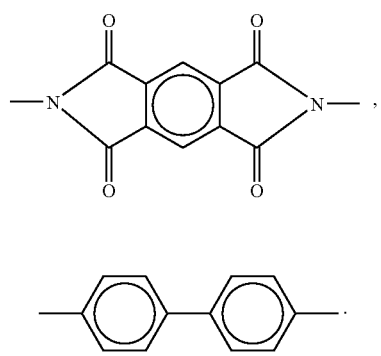
* * * * *